United States Patent
Murthy et al.

(10) Patent No.: US 6,605,498 B1
(45) Date of Patent: Aug. 12, 2003

(54) SEMICONDUCTOR TRANSISTOR HAVING A BACKFILLED CHANNEL MATERIAL

(75) Inventors: Anand S. Murthy, Portland, OR (US); Brian S. Doyle, Portland, OR (US); Brian E. Roberds, Escondido, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/112,170

(22) Filed: Mar. 29, 2002

(51) Int. Cl.[7] .................. H01L 21/336; H01L 21/00; H01L 29/04; H01L 29/76
(52) U.S. Cl. ............ 438/197; 438/44; 438/222; 438/416; 438/481; 257/18; 257/19; 257/64; 257/65; 257/67; 257/288
(58) Field of Search .................. 257/18, 19, 64, 257/65, 67, 288, 559; 438/42, 44, 222, 416, 429, 481, 197

(56) References Cited

U.S. PATENT DOCUMENTS 5,908,313 A    6/1999   Chau et al.

Primary Examiner—Matthew Smith
Assistant Examiner—Lex H. Malsawma
(74) Attorney, Agent, or Firm—Blakely, Sokoloff, Taylor & Zafman LLP

(57) ABSTRACT

A stressed channel is formed in a PMOS transistor by etching a recess and subsequently backfilling the recess with an epitaxially formed alloy of silicon, germanium, and an n-type dopant. The alloy has the same crystal structure as the underlying silicon, but the spacing of the crystal is larger, due to the inclusion of the germanium. An NMOS transistor can be formed by including carbon instead of germanium.

20 Claims, 3 Drawing Sheets

SEMICONDUCTOR TRANSISTOR HAVING A BACKFILLED CHANNEL MATERIAL

BACKGROUND OF THE INVENTION

1). Field of the Invention

This invention relates to the field of semiconductor manufacturing, and more specifically to a semiconductor transistor and its manufacture.

2). Discussion of Related Art

Integrated circuits are often manufactured in and on silicon and other semiconductor wafers. Such integrated circuits include literally millions of metal oxide semiconductor (MOS) field effect transistors, having gate lengths on the order of 0.05 microns. Such MOS transistors may include p-channel MOS (PMOS) transistors, and N-channel MOS (NMOS) transistors, depending on their dopant conductivity types.

Wafers are obtained by drawing an ingot of silicon out of a liquid silicon bath. The ingot is made of monocrystalline (single-crystal) silicon, and is subsequently sawed into individual wafers. A layer of silicon is then deposited over each wafer. Because the wafer is made of monocrystalline silicon, the deposition conditions can be controlled so that the layer of silicon deposits "epitaxially" on the monocrystalline silicon of the wafer. "Epitaxy" refers to the manner in which the silicon layer deposits on the wafer—the layer of silicon has a lattice which has a structure which follows a structure of a lattice of the monocrystalline silicon of the wafer. The layer of silicon is also substantially the same material as the monocrystalline silicon of the wafer, so that the lattice of the silicon layer also has substantially the same spacing as the spacing of the lattice of the monocrystalline silicon wafer.

A gate dielectric layer, a gate electrode, and spacers are subsequently formed on the layer of silicon. Ions are also implanted into the layer of silicon, to form source and drain regions on opposing sides of the gate electrode. A voltage can be applied over the source and drain regions. Current flows from the source region to the drain region through a channel below the gate dielectric layer when a voltage is applied to the gate electrode.

BRIEF DESCRIPTION OF THE DRAWINGS

The invention is described by way of examples with reference to the accompanying drawings, wherein.

DETAILED DESCRIPTION OF THE INVENTION

Figure 1:
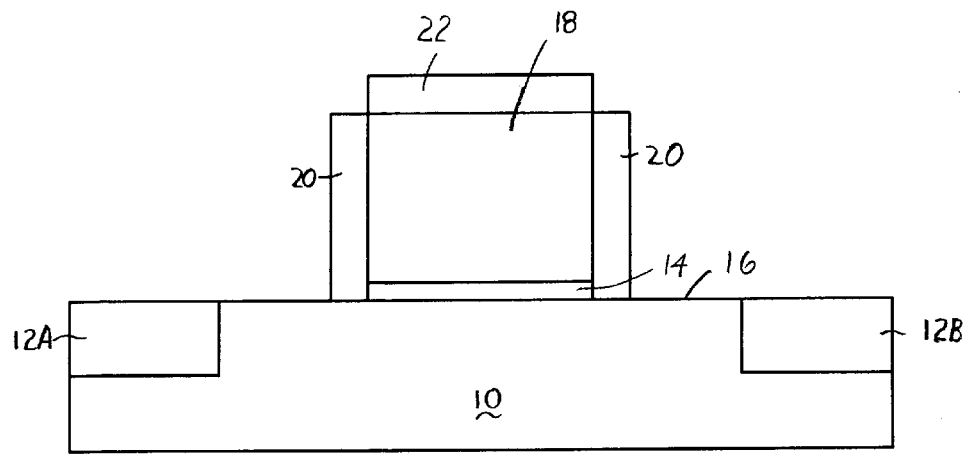
FIG. 1 is a cross-sectional side view of a partially manufactured transistor, manufactured according to one embodiment of the invention.

FIG. 1 of the accompanying drawings illustrates an epitaxial silicon layer 10 which is epitaxially formed on a monocrystalline wafer substrate. Because the silicon layer 10 is epitaxially formed, it follows the monocrystalline crystal structure of the wafer substrate. The silicon of the layer 10 is thus also monocrystalline.

A plurality of field isolation regions 12A and 12B are formed in the layer 10. The field isolation regions 12A and 12B isolate wells of different conductivity types, and isolate adjacent transistors. The field isolation regions 12A and 12B may, for example, be shallow trench isolation (STI) regions formed by etching a trench into the layer 10, and then filling the trench with deposited oxide.

A gate dielectric layer 14 is formed on a top surface 16 of the layer 10. The gate dielectric layer 14 may be a nitrided oxide layer formed to a thickness of between 5 and 30 Å, preferably approximately 8 Å. Processes are known in the art for forming nitrided oxide layers on silicon. (By contrast, it is much more difficult to form a nitrided oxide layer on germanium-doped silicon.)

A gate electrode 18 is formed on the gate dielectric layer 14. The gate electrode 18 is preferably between 1,000 and 3,500 Å thick. The gate electrode 18 may be formed by a blanket deposition of polysilicon, and patterning the polysilicon into the gate electrode 18, utilizing known photolithographic techniques. The gate electrode 18 typically has a gate length on the order of 0.05 microns. P-dopant ions are subsequently implanted into an exposed upper surface of the gate electrode 18. The dopant ions may, for example, be boron ions. The dopant ions make the gate electrode 18 conductive after a subsequent activation process.

Spacers 20 are formed on opposing sides of the gate electrode 18. The spacers 20 cover sides of the gate electrode 18, and also cover portions of the surface 16 adjacent and on opposing sides of the gate electrode 18. A mask 22 is deposited on top of the gate electrode 18. The spacers 20 and the mask 22 completely insulate the gate electrode 18 from an external environment. The spacers 20 and the mask 22 may, for example, be made of silicon nitride.

Figure 2:
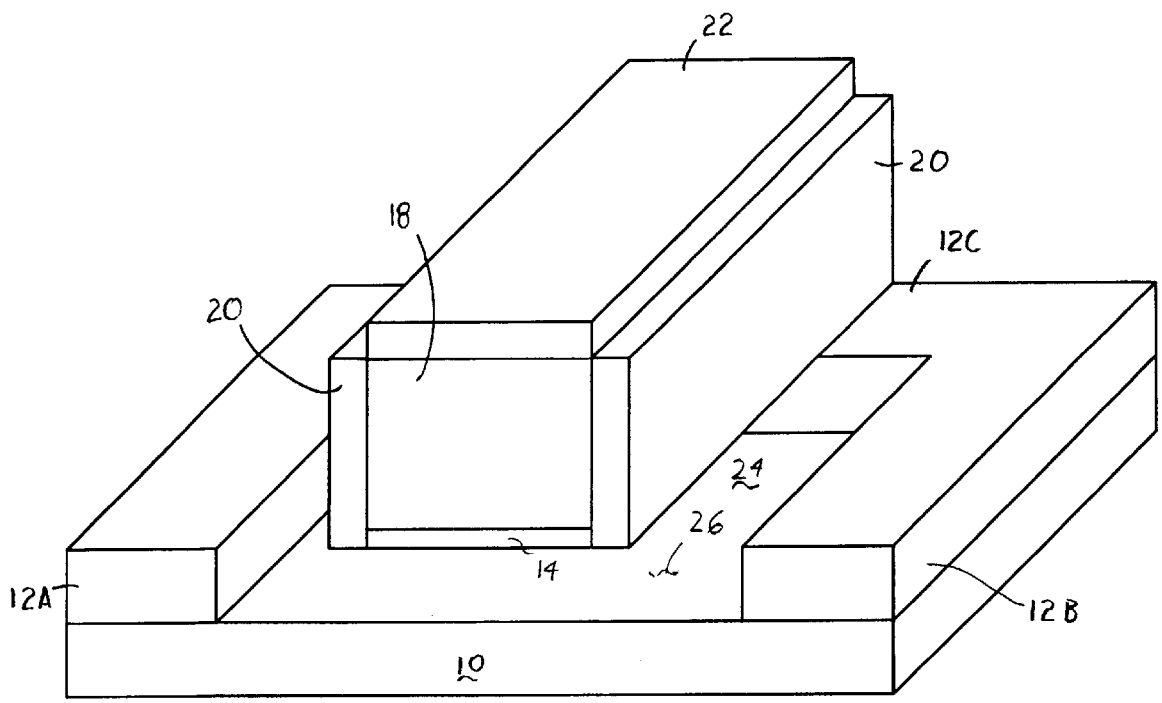
FIG. 2 is a perspective view of the structure of FIG. 1 after etching of a silicon layer thereof to form a recess.

FIG. 2 illustrates the structure of FIG. 1 after an etch step. An etchant such as $SF_6$ is used which removes the material of the layer 10 selectively over the materials of the field isolation regions 12, the gate dielectric layer 14, the spacers 20, and the mask 22. The material of the layer 10 is thus selectively removed starting with the surface 16 which is exposed, and proceeding underneath the gate dielectric layer 14. In this embodiment, etching is continued until cavities originating on opposing sides of the gate electrode 18 meet below the gate dielectric layer 14. As such, an entire region below the spacers 20 and the gate electrode 18 is removed, to form a recess 24.

In addition to the field isolation regions 12A and 12B on the left and the right of the gate electrode 18, there is another field isolation region 12C connecting rear portions of the field isolation regions 12A and 12B to one another. The field isolation region 12C supports a rear portion of the gate electrode 18. Another field isolation region, not shown, supports a front portion of the gate electrode 18.

The recess 24 is bound by the field isolation regions 12A, 12B, and 12C. The recess 24 has a lower surface 26 formed by an upper surface of the layer 10. The surface 26 is monocrystalline epitaxial silicon. Epitaxial silicon has a lattice with a known structure and spacing.

Figure 3:
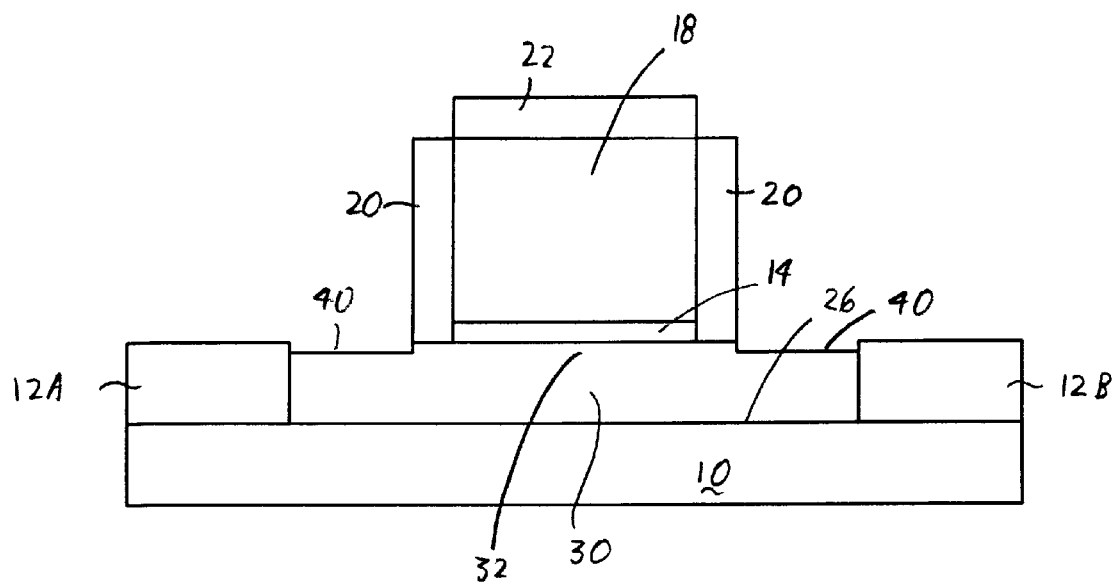
FIG. 3 is a view similar to FIG. 1, after the recess is filled with a channel material.

As shown in FIG. 3, the recess 24 is backfilled with a channel material 30. The channel material 30 is epitaxially formed on the surface 26. The channel material 30 includes silicon, germanium, and an n-type dopant. The channel material 30 can be formed in an ASME 3000 epitaxial reactor with the following processing conditions:

| | |
|---|---|
| Processing temperature: | 750° C. |
| Processing pressure: | 760 Torr |
| SiH$_2$Cl$_2$ flow rate: | 900 sccm |
| HCl flow rate: | 200 sccm |
| GeH$_4$ flow rate: | 100 sccm |
| PH$_3$ flow rate: | 100–600 sccm, depending on channel dopant concentration |
| H$_2$ carrier gas flow rate: | 40 slm |

A 1000 Å thick film results from a two-minute deposition under these conditions.

The silicon and the germanium form an alloy having a lattice which has the same structure as the structure of the lattice of the epitaxial silicon of the surface 26. The lattice of the alloy of silicon and germanium, however, has a larger spacing than the spacing of the lattice of the epitaxial silicon of the surface 26, at least in a relaxed state. Because the lattice of the alloy has the same structure as the surface 26, the channel material 30 forms epitaxially on the surface 26. However, because of the larger spacing of the lattice of the alloy, the channel material 30 creates a compressive stress in a channel 32 below the gate dielectric layer 14.

The germanium is present in the combination of the silicon and the germanium in about 15 atomic percent. An inverse relationship exists between the thickness of the film and the maximum germanium concentration before epitaxy breaks down. It has been found that epitaxy can be maintained with a germanium concentration of up to 20 atomic percent of the combination of the silicon and germanium by volume for a film having a thickness of 1000 Å, so that epitaxy tends to break down at an atomic percentage of germanium of above 20 atomic percent. A germanium concentration of between 50 and 60 atomic percent can be achieved without epitaxial breakdown for a film having a thickness of 100 Å.

The concentration of the n-dopant-type dopant is typically $5.0 \times 10^{18}$/cm$^3$. (The channel 32 is thus doped N+.)

The compressive stress reduces the effective mass in the channel 32, which in turn increases hole mobility. It has been found that a compressive stress in the channel 32 increases $I_{DSAT}$ of the eventual PMOS transistor by approximately 20 percent. The $I_{DLIN}$ is increased by approximately 40 percent.

A further advantage of depositing the channel material 30 is that dopant concentrations can be more accurately controlled. It may, for example, be possible to modify the dopant concentration while the channel material 30 is formed.

Figure 4:
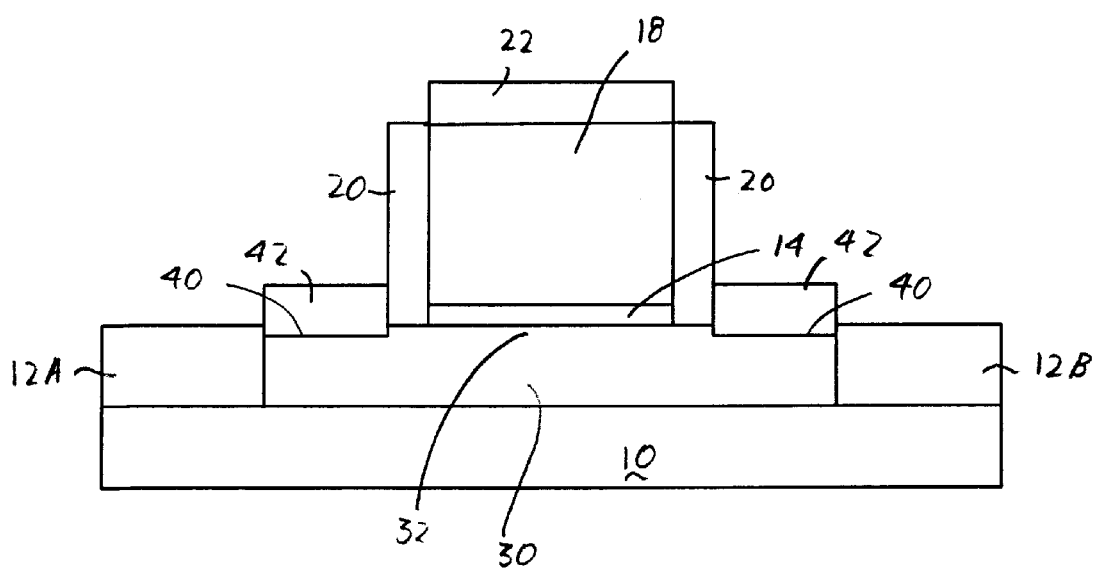
FIG. 4 is a view similar to FIG. 3, after source and drain films are formed on the channel material.

The channel material 30, after being formed, leaves exposed upper surfaces 40. As shown in FIG. 4, source and drain films 42 are grown on the surfaces 40. The source and drain films 42 include silicon and boron.

Because of the silicon, the source and drain films 42 are selectively grown only on the surfaces 40. The boron serves as a p-type dopant. The boron concentration is preferably approximately $3 \times 10^{20}$/cm$^3$. (The source and drain films 42 are thus doped P+.) The relatively large concentration of boron creates a relatively low resistance of approximately 0.9 mOhm-cm. Suitable results can be obtained with boron dopant concentrations of $1.0 \times 10^{20}$/cm$^3$ and above. The resistivity is preferably less than 1.1 mOhm-cm. The source and drain films 42 can be formed in an ASME 3000 epitaxial reactor with the following process conditions:

| | |
|---|---|
| Processing temperature: | 480° C. |
| Processing pressure: | 15 Torr |
| SiH$_2$Cl$_2$ flow rate: | 100 sccm |
| GeH$_4$ flow rate: | 80 sccm |
| HCl flow rate: | 90 sccm |
| B$_2$H$_6$ flow rate: | 120 sccm |
| H$_2$ carrier gas flow rate: | 10 slm |

A 1000 Å thick film results from a two-minute deposition under these conditions, with a boron concentration of $3 \times 10^{20}$/cm$^3$, a germanium concentration of 15 atomic percent, and a resistivity of 0.8 mOhm-cm.

It can thus be seen that a stressed channel 32 is formed utilizing the channel material 30. The challenges that exist with forming a gate dielectric layer on germanium-doped silicon are avoided by first forming the gate dielectric layer 14 and then forming the channel material 30.

In the present example, the layer 10 is epitaxial silicon, and the channel material 30 is silicon with a germanium additive. It may be possible to create similar structures utilizing additives other than germanium. The present example has also been described with reference to a PMOS transistor. An NMOS transistor may be manufactured in a similar manner. In an NMOS transistor, dopant conductivity types would be reversed. Furthermore, a tensile stress will be created in the channel. A tensile stress can be created utilizing a channel material of silicon which includes carbon. The silicon and carbon form an alloy which has a lattice with the same structure as the structure of the lattice of the epitaxial silicon, but with a smaller spacing. The channel material will then tend to contract, and create a tensile stress in the channel.

Figure 5:
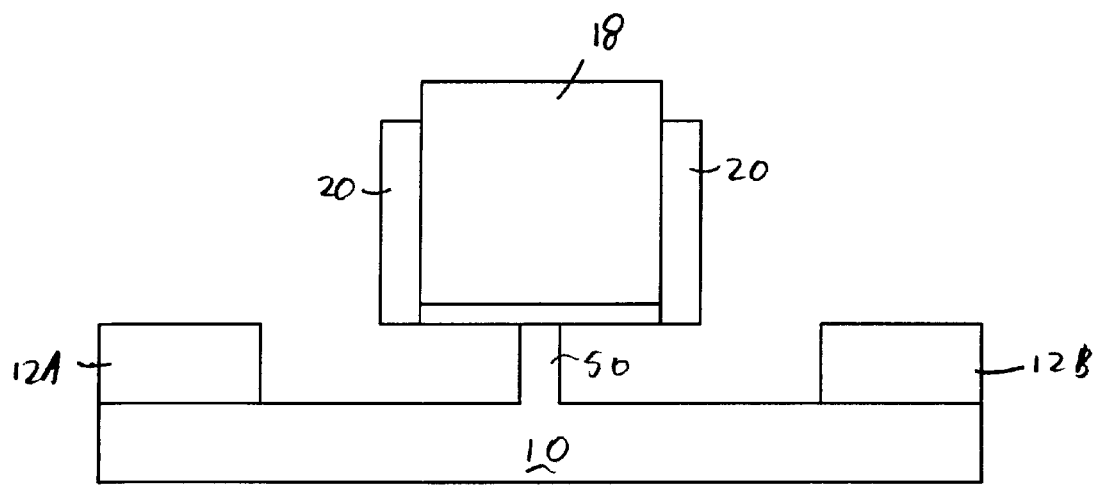
FIG. 5 is a cross-sectional side view of a partially manufactured transistor, manufactured according to another embodiment of the invention.
Figure 6:
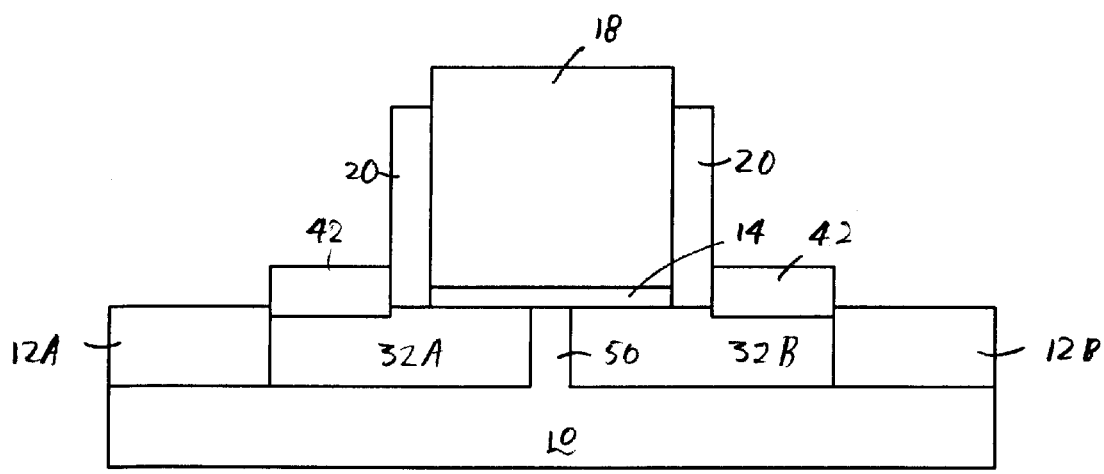
FIG. 6 is a view similar to FIG. 5 after the formation of channel material and source and drain films.

FIGS. 5 and 6 illustrate the manufacture of a transistor according to another embodiment of the invention. The structure of FIG. 5 is similar to the structure of FIG. 2, except that a thin sliver 50 of the layer 10 is not etched out. It may, for example, be difficult to control etching between transistors on the same substrate having different gate lengths. Two recesses are formed on opposing sides of the sliver 50 which, as shown in FIG. 6, are filled with channel material 32A and 32B. Further processing is then continued as hereinbefore described with reference to FIG. 4. The sliver 50 is typically pre-doped with n-type dopants. The channel material 32A and 32B recreate a stress within the channel 30 below the gate dielectric layer 14.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A semiconductor transistor comprising:
   a layer having a surface of a semiconductor material having a first lattice with a first structure and a first spacing;
   a channel material, which:
      (a) includes a channel dopant to have a first conductivity type; and
      (b) is formed epitaxially on the surface to have a second lattice with a second structure which is the same as the first structure, the second lattice having a second spacing which is different than the first spacing;
   source and drain regions on opposite sides of at least a portion of the channel material, including source/drain dopants to have a second conductivity type which is opposite to the first conductivity type;

a gate dielectric material on the channel material; and a conductive gate electrode on the gate dielectric material.

2. The semiconductor transistor of claim 1, wherein:

(a) the first conductivity type is selected from one of (i) an n-dopant conductivity type and (ii) a p-dopant conductivity type;

(b) the second spacing (i) is larger than the first spacing if the first conductivity type is an n-dopant conductivity type and (ii) is smaller than the first spacing if the conductivity type is a p-dopant conductivity type; and (c) the second conductivity type which (i) is a p-dopant conductivity type if the first conductivity type is an n-dopant conductivity type and (ii) is an n-dopant conductivity type if the first conductivity type is a p-dopant conductivity type.

3. The semiconductor transistor of claim 1, wherein the difference between the first spacing and the second spacing creates a stress in the channel.

4. The semiconductor transistor of claim 1, wherein the channel material includes the semiconductor material and an additive, the difference between the first spacing and the second spacing being due to the additive.

5. The semiconductor transistor of claim 4, wherein the semiconductor material is silicon and the additive is selected from one of germanium and carbon.

6. The semiconductor transistor of claim 5, wherein the additive is germanium.

7. The semiconductor transistor of claim 6, wherein the germanium comprises less than 20 atomic percent of the silicon and the germanium of the film material.

8. The semiconductor transistor of claim 7, wherein the germanium comprises approximately 15 atomic percent of the silicon and the germanium of the film material.

9. The semiconductor transistor of claim 1, wherein:

(a) the first conductivity type is selected from one of (i) an n-dopant conductivity type and (ii) a p-dopant conductivity type;

(b) the channel material (i) includes germanium if the first conductivity type is an n-dopant conductivity type and (ii) includes carbon if the first conductivity type is a p-dopant conductivity type; and (c) the second conductivity type which (i) is a p-dopant conductivity type if the first conductivity type is an n-dopant conductivity type and (ii) is an n-dopant conductivity type if the first conductivity type is a p-dopant conductivity type.

10. A semiconductor transistor comprising:

a layer with a surface of a semiconductor material having a first lattice with a first structure and a first spacing;

a channel material, which:

(a) includes a channel dopant to have a first conductivity type selected from one of (i) an n-dopant conductivity type and (ii) a p-dopant conductivity type; and (b) is formed epitaxially on the surface to have a second lattice with a second structure which is the same as the first structure, the second lattice having a second spacing which (i) is larger than the first spacing if the first conductivity type is an n-dopant conductivity type and (ii) is smaller than the first spacing if the first conductivity type is a p-dopant conductivity type;

source and drain regions on opposite sides of at least a portion of the channel material, including source/drain dopants to have a second conductivity type which (i) is a p-dopant conductivity type if the first conductivity type is an n-dopant conductivity type and (ii) is an n-dopant conductivity type if the first conductivity type is a p-dopant conductivity type;

a gate dielectric material on the channel material; and a conductive gate electrode on the gate dielectric material.

11. The semiconductor transistor of claim 10, wherein the channel material includes the semiconductor material and an additive, the difference between the first spacing and the second spacing being due to the additive.

12. The semiconductor transistor of claim 11, wherein the additive is germanium.

13. A method of making a semiconductor transistor, comprising:

forming a gate dielectric layer over a semiconductor substrate;

forming a gate electrode on the gate dielectric layer;

etching the semiconductor substrate to form a channel recess;

filling the channel recess with a channel material that includes channel dopants to have a first conductivity type; and forming source and drain regions on opposite sides of at least a portion of the channel material, the source and drain regions having a second conductivity type opposite to the first conductivity type.

14. The method of claim 13, wherein the gate dielectric layer is formed before the semiconductor substrate is etched to form the channel recess.

15. The method of claim 14, wherein, in cross-section, the channel recess is located below the entire gate dielectric layer.

16. The method of claim 14, wherein the channel recess has a surface of a material of the semiconductor substrate having a first lattice with a first structure and a first spacing, and the channel material is formed epitaxially on the surface to have a second lattice with a second structure which is the same as the first structure, the second lattice having a second spacing which is different than the first spacing.

17. The method of claim 14, further comprising:

epitaxially depositing the source and drain material to form the source and drain regions.

18. The method of claim 13, wherein the channel recess has a surface of a material of the semiconductor substrate having a first lattice with a first structure and a first spacing, and the channel material is formed epitaxially on the surface to have a second lattice with a second structure which is the same as the first structure, the second lattice having a second spacing which is different than the first spacing.

19. The method of claim 18, wherein:

(a) the first conductivity type is selected from one of (i) an n-dopant conductivity type and (ii) a p-dopant conductivity type;

(b) the second spacing (i) is larger than the first spacing if the first conductivity type is an n-dopant conductivity type and (ii) is smaller than the first spacing if the conductivity type is a p-dopant conductivity type; and (c) the second conductivity type which (i) is a p-dopant conductivity type if the first conductivity type is an n-dopant conductivity type and (ii) is an n-dopant conductivity type if the first conductivity type is a p-dopant conductivity type.

20. The method of claim 18, wherein:
(a) the first conductivity type is selected from one of (i) an n-dopant conductivity type and (ii) a p-dopant conductivity type;
(b) the channel material (i) includes germanium if the first conductivity type is an n-dopant conductivity type and (ii) includes carbon if the first conductivity type is a p-dopant conductivity type; and
(c) the second conductivity type which (i) is a p-dopant conductivity type if the first conductivity type is an n-dopant conductivity type and (ii) is an n-dopant conductivity type if the first conductivity type is a p-dopant conductivity type.

* * * * *